(12) United States Patent
Gupta et al.

(10) Patent No.: US 7,767,022 B1
(45) Date of Patent: Aug. 3, 2010

(54) METHOD OF ANNEALING A SUBLIMATION GROWN CRYSTAL

(75) Inventors: Avinash K. Gupta, Basking Ridge, NJ (US); Ilya Zwieback, Washington Township, NJ (US); Jihong Chen, Cincinnati, OH (US); Marcus Getkin, Flanders, NJ (US); Walter R. M. Stepko, Clover, SC (US); Edward Semenas, Allentown, PA (US)

(73) Assignee: II-VI Incorporated, Saxonburg, PA (US)

( * ) Notice: Subject to any disclaimer, the term of this patent is extended or adjusted under 35 U.S.C. 154(b) by 581 days.

(21) Appl. No.: 11/788,384

(22) Filed: Apr. 19, 2007

Related U.S. Application Data (60) Provisional application No. 60/793,020, filed on Apr. 19, 2006.

(51) Int. Cl.
*C30B 23/00* (2006.01)
(52) U.S. Cl. .................. 117/105; 117/108; 117/109
(58) Field of Classification Search ................ 117/105, 117/108, 109
See application file for complete search history.

(56) References Cited

U.S. PATENT DOCUMENTS

| | | | |
|---|---|---|---|
| 5,611,955 A | 3/1997 | Barrett et al. | |
| 5,667,587 A | 9/1997 | Glass et al. | |
| 5,683,507 A | 11/1997 | Barrett et al. | |
| 5,746,827 A | 5/1998 | Barrett et al. | |
| 6,383,902 B1 * | 5/2002 | Niemann et al. | 438/522 |
| 6,428,621 B1 | 8/2002 | Vodakov et al. | |
| 6,508,880 B2 | 1/2003 | Vodakov et al. | |
| 6,534,026 B2 | 3/2003 | Vodakov et al. | |
| 6,670,282 B2 | 12/2003 | Kuriyama et al. | |
| 6,786,969 B2 | 9/2004 | Kondo et al. | |
| 6,863,728 B2 | 3/2005 | Vodakov et al. | |
| 2005/0082542 A1 * | 4/2005 | Sumakeris et al. | 257/77 |
| 2005/0126471 A1 | 6/2005 | Jenny et al. | |

OTHER PUBLICATIONS

Tairov et al., "Investigation of Growth Processes of Ingots of Silicon Carbide Single Crystals", Journal of Crystal Growth, 1978, pp. 209-212, vol. 43, North-Holland Publishing Company.
Hobgood et al., "Silicon Carbide Crystal and Substrate Technology: A Survey of Recent Advances", Materials Science Forum, 2004, pp. 3-8, vol. 457-460, Trans Tech Publications, Switzerland.
Usov et al., "Effect of Implantation Temperature on Redistribution of Al in SiC During Annealing", Materials Science Forum, 2004, pp. 897-900, vol. 457-460, Trans Tech Publications, Switzerland.

* cited by examiner

*Primary Examiner*—Robert M Kunemund
(74) *Attorney, Agent, or Firm*—The Webb Law Firm (57) ABSTRACT

A crystal is sublimation grown in a crucible by way of a temperature gradient in the presence of between 1 and 200 Torr of inert gas. The pressure of the inert gas is then increased to between 300 and 600 Torr, while the temperature gradient is maintained substantially constant. The temperature gradient is then reduced and the temperature in the crucible is increased sufficiently to anneal the crystal. Following cooling and removal from the crucible, the crystal is heated in the presence of oxygen in an enclosure to a temperature sufficient to remove unwanted material from the crystal. Following cooling and removal from the enclosure, the crystal surrounded by another instance of the source material is heated in a crucible in the presence 200 and 600 Torr of inert gas to a temperature sufficient to anneal the crystal.

20 Claims, 6 Drawing Sheets

METHOD OF ANNEALING A SUBLIMATION GROWN CRYSTAL

CROSS REFERENCE TO RELATED APPLICATION

This application claims priority from U.S. provisional patent application No. 60/793,020, filed Apr. 19, 2006, which is incorporated herein by reference.

BACKGROUND OF THE INVENTION

1. Field of the Invention

The present invention relates to post-growth processing of sublimation grown crystals and, more particularly, to annealing of sublimation grown crystals, such as SiC crystals.

2. Description of Related Art

Wafers of silicon carbide of 4H and 6H polytypes serve as lattice-matched substrates to grow epitaxial layers of SiC and GaN, which are used for fabrication of SiC- and GaN-based semiconductor devices.

Large SiC single crystals used for semiconductor industrial applications are commonly grown by sublimation using a process called physical vapor transport (PVT).

Unfortunately, boules of crystals grown using this technique are stressed, which leads to cracking. Cracking can happen during cooling of the boule to room temperature, during mechanical separation of the boule from a seed-holder, as well as during subsequent steps of fabrication and polishing.

It would, therefore, be desirable to overcome the above problems and others by providing a method for reducing stress in sublimation grown crystals. Still other benefits of the present invention will become apparent to those of ordinary skill in the art upon reading and understanding the following detailed description.

SUMMARY OF THE INVENTION

The invention is a method of preparing a sublimation grown crystal having a reduced level of stress. The method includes (a) providing a growth chamber having therein a graphite crucible including a sublimation source and a seed crystal in spaced relation and an induction coil disposed around the growth chamber and operative in response to electrical power being applied thereto to inductively heat the graphite crucible in the presence of no more than 200 Torr of inert gas in the growth chamber, whereupon a temperature gradient forms in the graphite crucible with the sublimation source at a first sublimation temperature and the seed crystal at a second, lower temperature, and vapor from the sublimation source condenses on the seed crystal to form a grown crystal; (b) following the growth of the crystal in step (a), increasing the pressure of inert gas in the growth chamber to between 300 and 600 Torr and, simultaneously, controlling the power applied to the induction coil whereupon the temperature of the graphite crucible remains substantially constant; (c) following step (b), moving the induction coil relative to the graphite crucible, or vice versa, whereupon the temperature gradient in the graphite crucible is reduced; (d) following step (c), controlling the electrical power applied to the induction coil whereupon the temperature in the graphite crucible increases to a temperature sufficient to anneal the grown crystal; and (e) after an annealing period of time has elapsed during which the interior of the graphite crucible is at the temperature sufficient to anneal the grown crystal, controlling the electrical power applied to the induction coil whereupon the temperature of the interior of the graphite crucible decreases to room temperature over a cooling period of time.

The growth chamber of step (a) can include a thermal insulation between an interior of the growth chamber and an exterior of the graphite crucible.

The seed crystal and the grown crystal can both be single crystal silicon carbide (SiC). The sublimation source can be polycrystalline SiC. The annealing period of time can be between 6 and 24 hours. The cooling period of time can be between 12 and 36 hours. The annealing temperature can be between 2200° C. and 2450° C.

In step (d), the electrical power to the induction coil can be controlled to raise the temperature inside the interior of the graphite crucible to the annealing temperature over a period of time between 0.5 and 1 hour.

Inside the graphite crucible, the seed crystal can be disposed in a cavity of a graphite growth guide which is operative for constraining the lateral growth of the grown crystal to said inner cavity during growth of the grown crystal.

The seed crystal can be coupled to an interior of the graphite crucible directly, via a graphite seed-holder disposed between the seed crystal and the interior of the graphite crucible and/or via a graphite growth guide which is operative for constraining the lateral growth of the grown crystal to an inner cavity of the growth guide during growth of the grown crystal.

The method can further include: (f) in the presence of an oxygen rich atmosphere, heating the grown crystal, the seed crystal and any graphite that is attached to the grown crystal, the seed crystal, or both, as a result of the growth of the grown crystal to a reaction temperature sufficient to cause the oxygen to react with the graphite to form a gas and become detached from the seed crystal and the grown crystal whereupon the grown crystal, the seed crystal, or both, are substantially graphite free.

Following step (f), the substantially graphite free grown crystal and, the substantially graphite free seed crystal, or both, can be cooled to room temperature.

The heating to the reaction temperature in the presence of an oxygen rich atmosphere can be for a period of time between 6 and 12 hours. The reaction temperature can be between 600° C. and 1100° C. or, more desirably, between 900° C. and 1100° C. The cooling to room temperature of the substantially graphite free grown crystal, the substantially graphite free seed crystal, or both, can occur at a rate between 50° C. and 100° C. per hour.

The seed crystal and the grown crystal can both be single crystal silicon carbide (SiC). The reaction temperature can cause the single crystal SiC to react with the oxygen atmosphere to form a layer of $SiO_2$ on exposed surfaces of the seed crystal and the grown crystal.

Step (f) can take place in a furnace.

The method can further include: (g) surrounding the substantially graphite free grown crystal by a source material made of the same material as the grown crystal; (h) heating the substantially graphite free grown crystal and surrounding source material for an annealing period of time in the presence of an inert gas to a temperature sufficient to anneal the grown crystal; (i) after the annealing period of time of step (h) has elapsed, reducing the temperature of the substantially graphite free grown crystal and surrounding source material to room temperature over a cooling period of time.

The substantially graphite free grown crystal and the surrounding source material can be made from silicon carbide (SiC).

During step (h), the substantially graphite free grown crystal can be in direct contact with the surrounding source material or the substantially graphite free grown crystal can be housed in a thin-walled porous graphite container that separates the grown crystal from the surrounding source material which can be received in a graphite crucible (susceptor) which is inductively heated to cause the heating of step (h).

The graphite crucible (susceptor) can be heated in a manner to minimize a temperature gradient across the substantially graphite free grown crystal and the surrounding source material.

The invention is also a method of preparing a stress reduced sublimation grown crystal. The method includes (a) sublimation growing a crystal in a crucible by way of a temperature gradient between the crystal and a source material in the presence of inert gas at a pressure between 1 and 200 Torr, wherein the source material is made of the same material as the crystal; (b) with the crystal in the crucible, increasing the pressure of the inert gas to between 300 and 600 Torr while substantially maintaining the temperature of step (a); (c) with the crystal in the crucible, reducing the temperature gradient in the crucible; (d) increasing the temperature in the crucible to a temperature sufficient to anneal the grown crystal; and (e) following annealing of the grown crystal in the crucible, decreasing the temperature of the interior of the crucible to room temperature.

The method can include: (f) following removal of the grown crystal from the crucible, heating the grown crystal in the presence of an oxygen rich atmosphere in an enclosure to a temperature sufficient to remove from the grown crystal material that is not part thereof.

Lastly, the method can include: (g) following removal of the grown crystal from the enclosure, heating the grown crystal surrounded by another instance of the source material in a crucible in the presence of an inert gas at a pressure between 200 and 600 Torr, wherein the grown crystal is heated to a temperature sufficient to anneal the grown crystal.

DETAILED DESCRIPTION OF THE INVENTION

The present invention will be described with reference to the accompanying figures where like reference numbers correspond to like elements.

Large silicon carbide (SiC) single crystals used for semiconductor applications are commonly grown by sublimation using a process called physical vapor transport (PVT).

Figure 1:
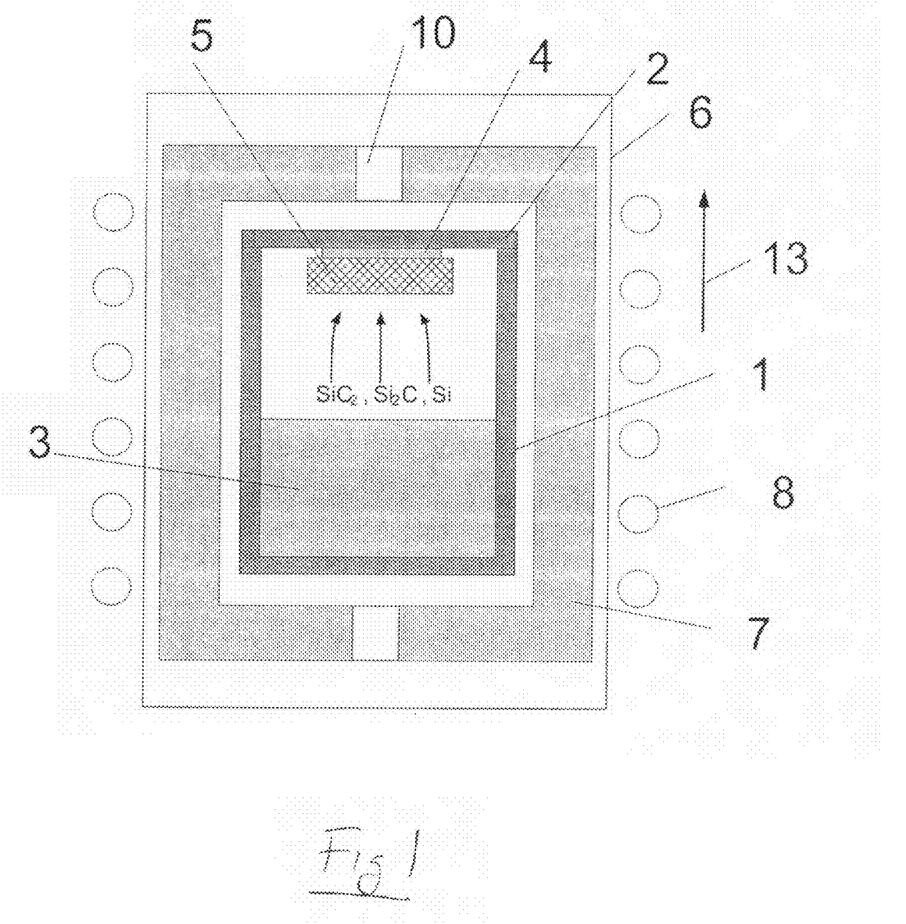
FIG. 1 is a cross-sectional diagrammatic view of a system that can be used for sublimation growth of a single crystal and the in-situ annealing of the grown crystal.

With reference to FIG. 1, PVT growth is carried out in a graphite growth crucible 1 sealed with a graphite lid 2 and loaded with a polycrystalline SiC source 3 and a monocrystalline SiC seed crystal 4. Generally, source 3 is disposed at the bottom of crucible 1 and seed crystal 4 at the top of crucible 1. Seed crystal 4 is often mounted directly to crucible lid 2 using adhesives or mechanical means (not shown). However, this is not to be construed as limiting the invention since seed crystal 4 can be mounted to crucible lid 2 by way of a graphite seed-holder disposed between seed crystal 4 and lid 2.

Loaded crucible 1 is placed inside a growth chamber 6 where it is surrounded by thermal insulation 7, desirably made of fibrous graphite foam.

RF heating is commonly used in SiC sublimation growth for heating crucible 1 to growth temperatures. RF heating is typically accomplished by way of an RF coil 8 placed outside chamber 6, which comprises water-cooled walls made of fused silica. The use of electrically nonconductive fused silica permits electromagnetic field generated by RF coil 8 to penetrate inside chamber 6 and to couple with the graphite that forms crucible 1, which serves as an efficient RF susceptor. The use of RF coil 8 to heat crucible 1 and, hence, source 3 and seed crystal 4 to crystal growth temperatures is not to be construed as limiting the invention since it is envisioned that other suitable and/or desirable means for heating source 3 and seed crystal 4 to a suitable temperature for growing a SiC single crystal 5 on seed crystal 4 by sublimation can be used, such as resistive heating.

During PVT growth, crucible 1 is heated to the growth temperature, which is generally between 2000° C. and 2300° C. The temperatures of source 3 and seed crystal 4 can be monitored using optical pyrometers, which can be aimed through bottom and top openings 10 in thermal insulation 7.

RF coil 8 is positioned with respect to crucible 1 in such a fashion that the temperature of source 3 is maintained higher than that of seed crystal 4. Desirably, the difference between the temperatures of source 3 and seed crystal 4 is between 10° C. and 200° C.

Upon reaching a suitably high temperature, source 3 vaporizes and fills crucible 1 with volatile molecular species of $Si_2C$, $SiC_2$ and Si. The temperature difference between source 3 and seed crystal 4 forces the vapors to migrate and precipitate on seed crystal 4 forming single crystal 5. In order to control the growth rate and ensure the formation of crystal 5 having a sufficiently high quality, PVT growth is carried out under a pressure of inert gas, such as argon or helium, desirably between 1 and 200 Torr, and more desirably, between 1 and 100 Torr.

Figure 2:
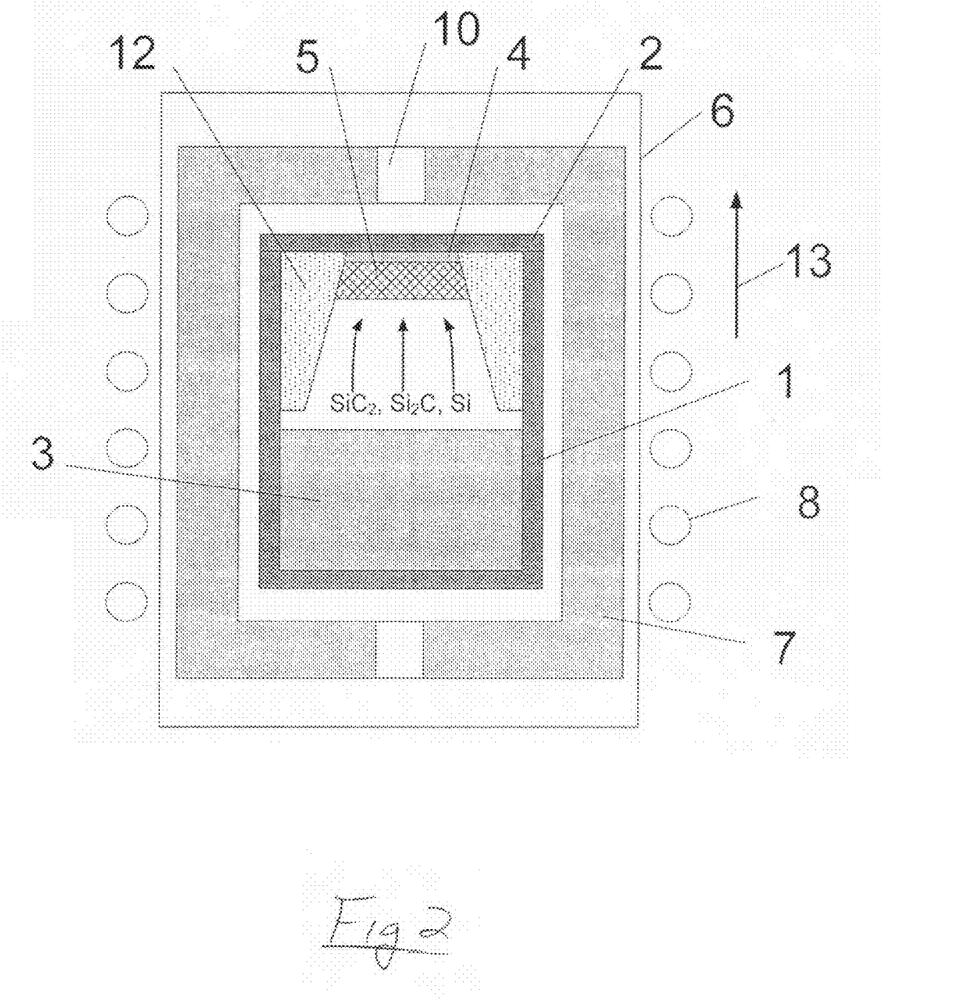
FIG. 2 is a view of the system in FIG. 1 including a growth guide for constraining the lateral expansion of the crystal during growth.

With reference to FIG. 2 and with continuing reference to FIG. 1, it is generally known that during growth, single crystal 5 expands laterally beyond the size of seed 4, as shown schematically in FIG. 1. As an alternative to allowing uncontrolled lateral growth of crystal 5, a graphite growth guide 12 can surround seed crystal 4 and force single crystal 5 to attain the shape of the inner cavity of graphite growth guide 12 as shown in FIG. 2. In FIG. 2, growth guide 12 is shown as having a conical shaped inner cavity. However, this is not to be construed as limiting the invention since it is envisioned that the inner cavity of growth guide 12 can have a cylindrical shape or any suitable and/or desirable shape.

Regardless of whether single crystal 5 is grown in the inner cavity of growth guide 12 as shown in FIG. 2 or without growth guide 12 as shown in FIG. 1, boules of single crystal 5 are stressed, often severely. There can be several reasons for such stress. It is believed that the main reason for such stress is the strong temperature gradients in single crystal 5 during growth. Stress can also be caused by the presence of misoriented grains or other defects residing at the periphery of sublimation-grown single crystal 5. Another possible cause for stress in single crystal 5 can be a coefficient of thermal expansion (CTE) mismatch between single crystal 5 and lid 2 or a graphite seed-holder (not shown) sandwiched between lid 2 and seed crystal 4. Spatially non-uniform distribution of dopants and impurities can also cause stress in crystal 5. Regardless of how stress is induced in single crystal 5, such stress manifests itself in cracking, which can happen during the cooling of the boule of single crystal 5 to room temperature, during its separation from the graphite seed-holder (not shown), lid 2 or growth guide 12, or during boule grinding, slicing, wafer lapping, or polishing. This negatively impacts the yield of high-quality substrates from single crystal 5.

Heretofore, reduction of thermo-elastic stress in crystals, such as single crystal 5, was accomplished through moderation of temperature gradients in the boule during growth of single crystal 5, especially, radial temperature gradients. However, when applied to larger-diameter boules of crystals, such as, without limitation, SiC crystals, grown with or without the use of growth guide 12, the use of controlled temperature gradients during growth was only marginally effective.

In order to reduce stress in boules of grown single crystals 5, a post-growth annealing process can be utilized. In accordance with the present invention, such annealing can be carried out in-situ immediately after growth is finished and without removing the grown boule of single crystal 5 from crucible 1. The process of in-situ annealing in accordance with the present invention will now be described.

With the interior of crucible 1 at growth temperature, i.e., having the desired temperature gradient thereacross, growth chamber 6 is filled with inert gas, such as, without limitation, argon or helium, to a pressure desirably between 300 and 600 Torr. In other words, the inert gas pressure in the interior of chamber 6 is increased from the pressure utilized to grow single crystal 5 to between 300 and 600 Torr. Increasing this inert gas pressure in growth chamber 6 to between 300 and 600 Torr reduces the vapor transport from source 3 to crystal 5 practically to zero and, thus, essentially stops the growth of crystal 5. At the same time, increased inert gas pressure increases the thermal conductance in the space between crucible 1 and growth chamber 6. Specifically, the thermal conductance of the fibrous graphite foam that comprises thermal insulation 7 situated in the space between crucible 1 and growth chamber 6 increases with the increase in inert gas pressure. Therefore, if the level of power supplied to RF coil 8 is kept constant, increasing the inert gas pressure in growth chamber 6 to a pressure between 300 and 600 Torr causes a noticeable temperature drop in crucible 1. Such temperature drop, if allowed to occur, can be harmful to the quality of grown crystal 5. In order to avoid this harmful temperature drop, the pressure of the inert gas in growth chamber 6 is changed gradually, over a period of time between 20 and 40 minutes, utilizing a manual needle valve or an electronic mass-flow controller. Simultaneously, the RF electrical power applied to RF coil 8 is appropriately adjusted in order to maintain the interior temperature of crucible 1 as constant as possible.

The inert gas used for growing single crystal 5 can be the same or different than the inert gas utilized to stop vapor transport inside crucible 1. Because of the porosity of crucible 1 to gases, the pressure of inert gas inside crucible 1 very quickly becomes the same as the pressure of inert gas inside of growth chamber 6. Thus, introducing a certain pressure of inert gas into growth chamber 6 will result in the same pressure of inert gas being realized inside of crucible 1.

Once the process of introducing 300 to 600 Torr of inert gas into growth chamber 6 while maintaining the temperature of crucible 1 as constant as possible is complete, RF coil 8 is raised in a vertical direction, shown by arrow 13, relative to growth chamber 6, or growth chamber 6 is lowered in a vertical direction relative to coil 8, in a direction opposite arrow 13, a suitable distance in order to reduce, desirably to zero, the difference between the temperature at the bottom of crucible 1 and the temperature at the top of crucible 1. In one non-limiting embodiment, raising RF coil 8 in the vertical direction shown by arrow 13 relative to growth chamber 6 between 0.25 and 1 inch from the position RF coil 8 occupied during the growth of single crystal 5 was found satisfactory. However, this is not to be construed as limiting the invention since it is envisioned that RF coil 8 can be moved relative to growth chamber 6, or vice versa, by any suitable and/or desirable distance sufficient to reduce, desirably to zero, the difference between the temperature at the bottom of crucible 1 and the temperature at the top of crucible 1. The end result of adjusting the position of RF coil 8 relative to growth chamber 6 in this manner is a sufficiently reduced temperature gradient in the boule of single crystal 5.

The proper distance for movement of RF coil 8 in the vertical direction can be established by monitoring the temperatures at the bottom and the top of crucible 1 using optical pyrometers aimed at the bottom and the top of crucible 1 through openings 10 in thermal insulation 7. Alternatively, the proper distance for movement of RF coil 8 can be predetermined empirically, from previous separate experiments.

Next, the temperature of crucible 1 and, hence, single crystal 5 is raised to an appropriate temperature where annealing of single crystal 5 takes place without incurring large material losses due to vaporization. It has been found that this temperature is desirably between 2200° C. and 2450° C. and, more desirably, between 2300° C. and 2350° C.

Typically, the appropriate annealing temperature is reached by increasing the power applied to RF coil 8 by 5 to 10 percent. In order to avoid thermal shock of single crystal 5, the RF electrical power applied to RF coil 8 is slowly ramped, with a ramp time between 0.5 and 1 hour.

In order to reduce growth-related stress, the grown boule of single crystal 5 is soaked at the appropriate annealing temperature for a period of time, such as, without limitation, between 6 and 24 hours. At the high temperature of annealing, rapid diffusion processes take place in the bulk of single crystal 5 leading to efficient structural relaxation and healing of defects. Upon completion of annealing, single crystal 5 is cooled to room temperature over a suitable period of time, such as, without limitation, between 12 and 36 hours, that avoids the introduction of stress and defects into the annealed single crystal 5.

Annealed single crystal 5 can be separated from lid 2, or from a seed-holder utilized to couple single crystal 5 to lid 2, and/or from graphite growth guide 12 mechanically by way of a saw. However, it has been observed that sawing seed crystal 4 and/or single crystal 5 grown on seed crystal 4 from its underlying support structure or from its surrounding structures induces cracking in single crystal 5 even after in-situ annealing.

Moreover, the sawing of single crystal 5 grown from seed crystal 4 where growth guide 12 is used as shown in FIG. 2 is particularly difficult since the boule of single crystal 5 is typically attached to growth guide 12.

It would, therefore, be desirable, to remove single crystal 5 from lid 2, from the seed-holder (not shown) and/or from growth guide 12, as the case may be, while avoiding cracking of single crystal 5 and/or introducing defects into single crystal 5.

A system and method for removing single crystal 5 from lid 2 and growth guide 12 will now be described with reference to FIG. 3. However, this is not to be construed as limiting the invention since it is envisioned that the following system and method can also be utilized for removing single crystal 5 from any one or combination of lid 2, the seed-holder (not shown), and/or growth guide 12.

Figure 3:
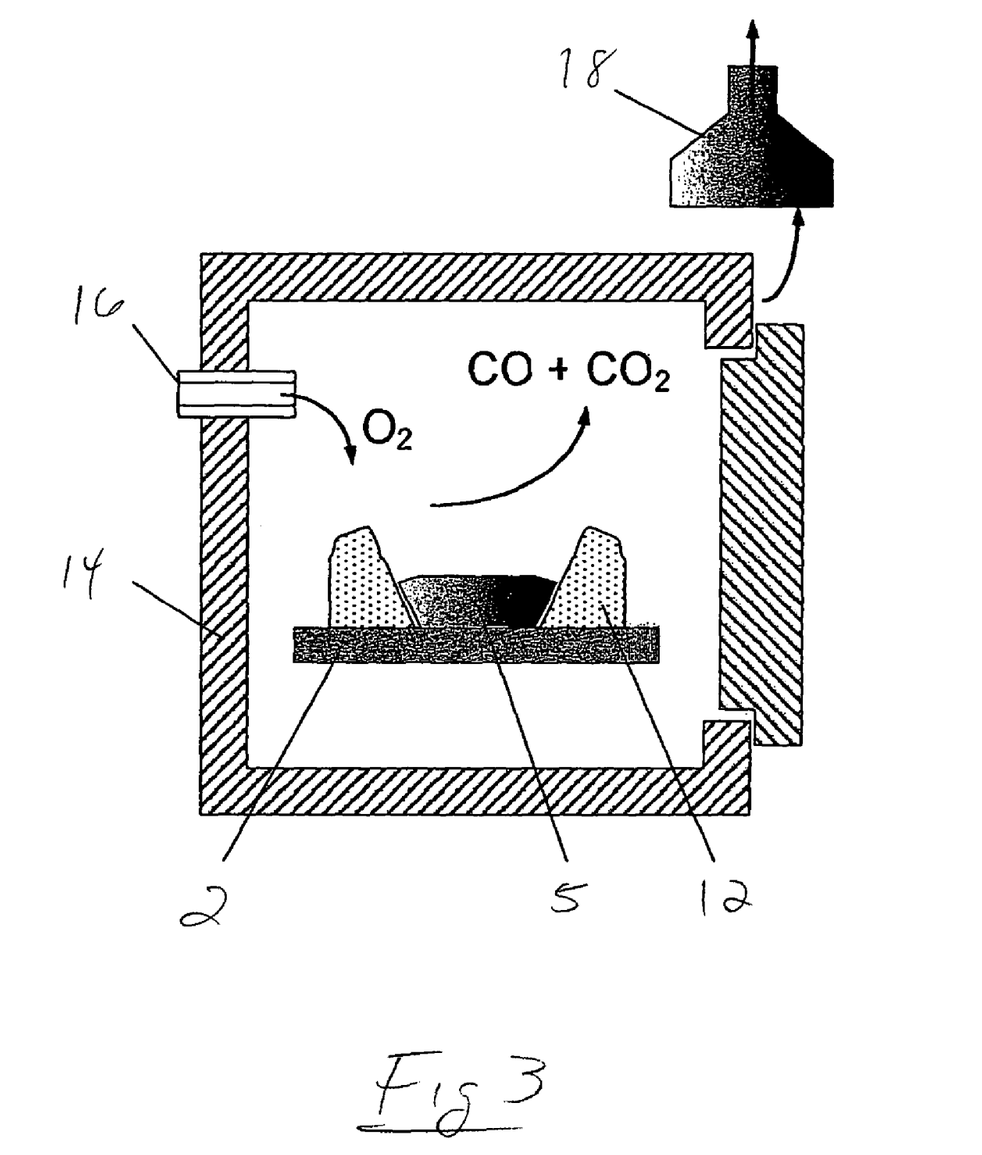
FIG. 3 is a cross-sectional diagrammatic view of a furnace that can be utilized for removing unwanted material, such as graphite, from the grown crystal in an oxygen atmosphere.

As shown in FIG. 3, the boule of single crystal 5 attached to graphite lid 2, either directly or via a graphite seed-holder, and surrounded by graphite growth guide 12 is placed in a resistively-heated furnace 14. Furnace 14 is equipped with an oxygen inlet 16. Furnace 14 is controlled to ramp to a target temperature, desirably between 700° C. and 1100° C. Desirably, the rate of temperature increase within furnace 14 is between 80° C. and 150° C. per hour.

At the beginning of the heating cycle, a flow of oxygen into the furnace is established at a suitable rate, desirably between three and seven standard cubic feet per hour. Upon the interior temperature of furnace 14 reaching 600° C. to 700° C., the flow of oxygen into furnace 14 starts attacking graphite, in particular, the graphite at the interface of crystal 5 and growth guide 12 and/or lid 2 or the seed-holder attached thereto, to form $CO/CO_2$. Desirably, the flow of oxygen is high enough to minimize the formation of CO. An exhaust vent 18 can be provided to exhaust away all gaseous products of oxidation, including any traces of CO that may leak from furnace 14 into the ambient atmosphere surrounding furnace 14. Upon reaching the target temperature, single crystal 5, growth guide 12 and lid 2 (or the seed-holder attached thereto) are soaked at said target temperature in the presence of the flow of oxygen for a desired period of time sufficient to separate single crystal 5 from growth guide 12 and lid 2 (or from the seed-holder attached thereto). In one non-limiting embodiment, the interior of furnace 14 is kept between 900° C. and 1000° C. for a period between 6 to 12 hours. Thereafter, the interior of furnace 14 is cooled to room temperature at a rate, desirably, between 50° C. and 100° C. per hour.

At elevated temperatures, SiC reacts with oxygen to form a thin layer of $SiO_2$ on the exposed surfaces of single crystal 5. Typically, the thickness of this $SiO_2$ layer is less than 0.1 micron. The presence of the oxide layer on the exposed surfaces of single crystal 5 does not have any effect on the properties thereof.

While the use of furnace 14 has been described in connection with the separation of single crystal 5 from lid 2 and growth guide 12, it is to be appreciated that furnace 14 and the above-described method can be utilized for removing single crystal 5 from lid 2 or a seed-holder attached thereto absent growth guide 12. Thus, single crystal 5 grown on lid 2 by way of seed crystal 4 in FIG. 1 can be placed inside furnace 14 and single crystal 5 removed from lid 2 in the manner described above in connection with single crystal 5, lid 2 and growth guide 12. Accordingly, the foregoing description of the separation of single crystal 5 from growth guide 12 and lid 2 by way of an oxygen atmosphere inside of heated furnace 14 is not to be construed as limiting the invention.

Figure 4:
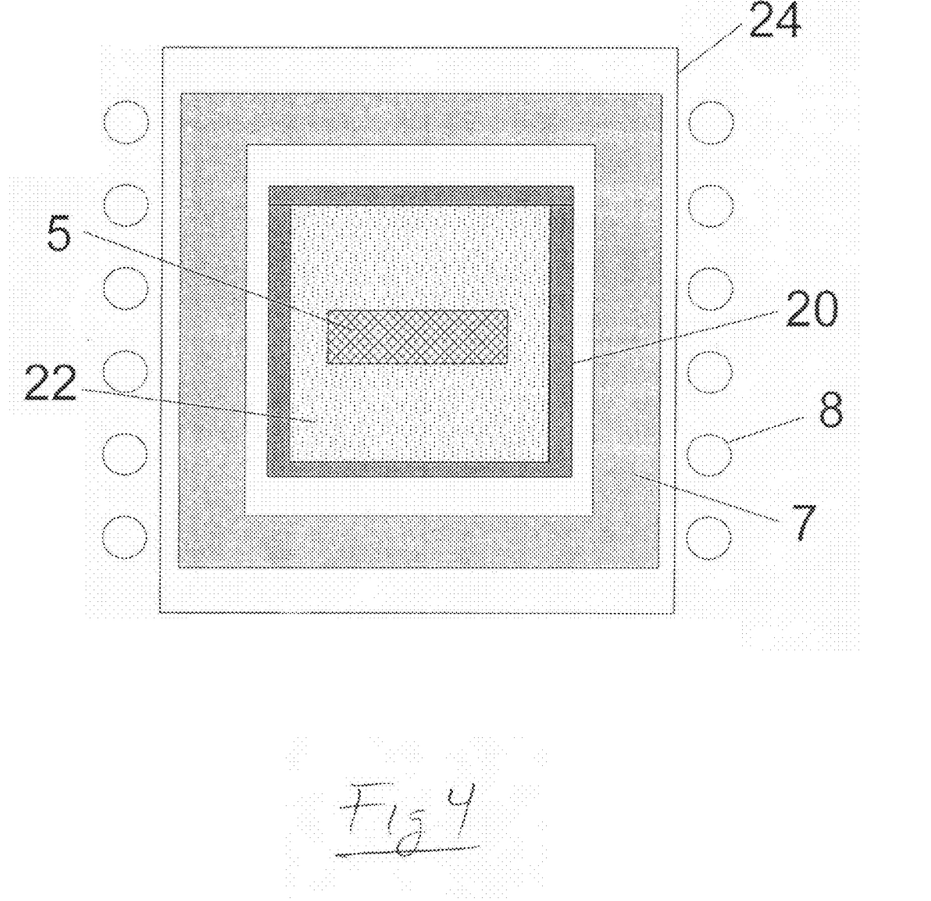
FIG. 4 is a cross-sectional diagrammatic view of a system for ex-situ annealing of a boule of grown crystal

A process of ex-situ annealing of single crystal 5 will now be described. With reference to FIG. 4 and with continuing reference to FIGS. 1-3, also or alternatively to in-situ annealing of single crystal 5 in the manner described above in connection with FIGS. 1 and 2, once grown single crystal 5 has been separated from lid 2 (or a seed-holder attached to lid 2) and, if provided, growth guide 12, the separated, essentially graphite-free single crystal 5 can be placed inside a sealed graphite crucible 20, where it is surrounded by high-purity polycrystalline SiC source 22. In one exemplary non-limiting embodiment, graphite crucible 20 desirably has wall thicknesses between 8 mm and 20 mm. Crucible 20 is desirably made of high-density, low-porosity graphite in order to keep vaporization losses from source 22 to a minimum. Source 22 is positioned in close proximity to single crystal 5. Desirably, single crystal 5 is in direct contact with source 22 and, more desirably, single crystal 5 is buried in source 22 as shown FIG. 4. Desirably, the amount of source 22 contained in crucible 20 is at least two times the weight of single crystal 5.

Figure 5:
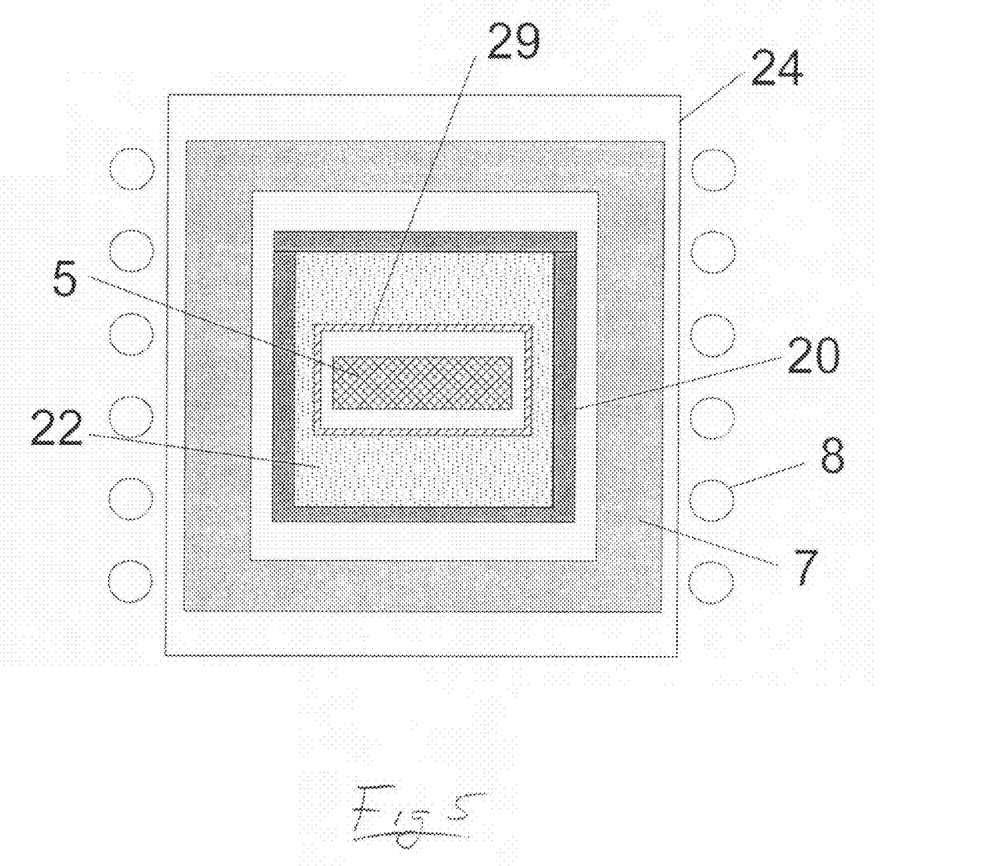
FIG. 5 is a cross-sectional diagrammatic view of the system of FIG. 4 including an enclosure for containing the boule of grown crystal during ex-situ annealing of said boule of grown crystal.

With reference to FIG. 5 and with continuing reference to FIG. 4, alternatively, essentially graphite-free single crystal 5 can be placed inside a thin-walled enclosure 29 made of low-density, porous graphite and having wall thicknesses, desirably, between 2 and 6 mm. In one exemplary non-limiting embodiment, enclosure 29 is made of porous graphite having the density of 1.05 g/cm3 and porosity of 50%. Enclosure 29 including single crystal 5 can be loaded into crucible 20, made of high-density, low-porosity graphite, where enclosure 29 is surrounded by high-purity polycrystalline SiC source 22 having a grain size desirably between 0.5 mm and 2 mm. Desirably, enclosure 29 is buried in source 22. The dimensions of enclosure 29 are such that the distance between single crystal 5 and interior walls of enclosure 29 are desirably less than 10 mm and, more desirably, less than 5 mm. Desirably, the amount of source 22 contained in crucible 20 is at least two times the weight of single crystal 5.

Figure 6:
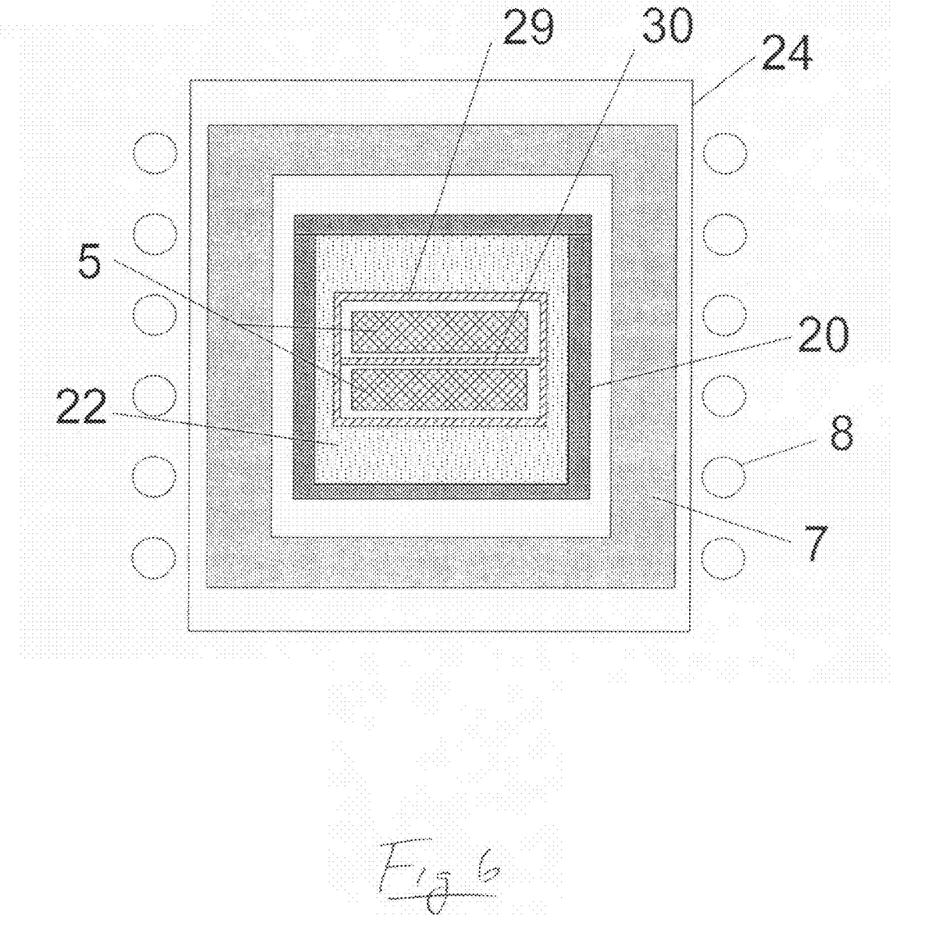
FIG. 6 is a cross-sectional diagrammatic view of the system of FIG. 5 including a divider for separating two or more boules of grown crystals during ex-situ annealing of said boules.

With reference to FIG. 6 and with continuing reference to FIGS. 4 and 5, alternatively, two or more boules of single crystal 5 can be placed inside of enclosure 29, having a wall thickness desirably between 2 mm and 6 mm. The boules of single crystal 5 inside graphite enclosure 29 can be separated from each other by a disc or divider 30 also made of porous graphite and desirably between 2 mm and 6 mm thick. Graphite enclosure 29 containing two or more boules of single crystal 5 can be loaded into crucible 20 made of high-density, low-porosity graphite. Inside graphite crucible 20, porous enclosure 29 is surrounded by polycrystalline SiC source 22, having a grain size desirably between 0.5 mm and 2 mm. Desirably, enclosure 29 containing single crystals 5 is buried in source 22. The amount of SiC source 22 is desirably exceeds the combined weight of the boules of single crystal 5.

Crucible 20 including crystal(s) 5 either alone (as shown in FIG. 4) or within enclosure 29 (as shown in FIGS. 5 and 6) surrounded by source 22 is disposed inside a gas-tight chamber 24, desirably made of fused silica. In preparation for annealing, chamber 24 is evacuated and then filled with a pure inert gas, such as argon or helium, to a predetermined pressure, desirably between 200 and 760 Torr Following this, graphite crucible 20 is heated to an annealing temperature, desirably, between 1800° C. and 2600° C. and, more desirably, between 2200° C. and 2400° C. The means of heating can either be RF coil 8 or a resistive heater (not shown). Desirably, temperature gradients in graphite crucible 20, both axially and radially are minimized.

The atmosphere inside crucible 20 during annealing is inert gas, such as argon or helium, having a total impurity concentration desirably below 100 parts per million (ppm) and, more desirably, below 10 ppm. For annealing of a nitrogen-doped N-type single crystal 5, the inert gas can include nitrogen in a concentration desirably from 0.2% to 5%. Depending on the type of single crystal 5 being annealed and the desired effect of annealing, the annealing atmosphere may also or alternatively include other gaseous additives such as, without limitation, hydrogen, silicon, carbon, chlorine and fluorine.

A desired duration of annealing in chamber 24 is between 4 and 100 hours. However, this is not to be construed as limiting the invention since the annealing time can be less than 4 hours, or extended beyond 100 hours.

The polycrystalline SiC component of source 22 is produced separately and is desirably nominally stoichiometric. Any suitable and/or desirable technique can be utilized to produce the high-purity polycrystalline SiC source 22. Desirably, the high-purity polycrystalline SiC source 22 is produced by direct synthesis from elemental silicon and carbon.

Desirably, the levels of unintentional boron and metal impurities in source 22 is below the detection limits of glow discharge mass spectrometry (GDMS). The level of unintentional nitrogen in source 22 is desirably below $10^{15}$ cm$^{-3}$. The grain size of source 22 is desirably between 0.1 mm and 2 mm and, more desirably, between 0.3 mm and 1 mm.

If desired, elemental silicon, in the form of powder, chips, pellets and/or granules of semiconductor purity silicon, can be added to source 22. Desirably, the grain size of the silicon chips, pellets and/or granules is between 0.5 mm and 2 mm. The purpose of the silicon in source 22 is to achieve a silicon-rich composition of the vapor phase during annealing, which is desirable for eliminating vaporization losses from single crystal 5 and graphization of the surface of single crystal 5. The amount of silicon added to source 22 is desirably below 15% of the weight of source 22.

If desired, source 22 can contain other solid additives depending on the type of single crystal 5 being annealed. For example, for annealing of vanadium-doped semi-insulating SiC single crystal 5, source 22 can include vanadium, desirably in concentrations between 200 ppmw and 1000 ppmw of vanadium. For aluminum-doped single crystals 5, source 22 can include aluminum, desirably in concentrations between 200 ppmw and 1000 ppmw of aluminum. For boron-doped crystals 5, source 22 contains boron, desirably in concentrations between 50 ppmw and 100 ppmw of boron. Other solid dopants may be added to source 22 in order to produce desired effects on the properties of single crystal 5 being annealed.

In one exemplary embodiment, the foregoing method of ex-situ post growth annealing of single crystal 5 was accomplished utilizing the setup shown schematically in FIG. 4. Specifically, a three inch diameter 6H—SiC boule single crystal 5 weighing 180 grams was subjected to high temperature annealing in accordance with the present invention. Source 22 weighed 400 grams and comprised 90.9% of high-purity polycrystalline SiC plus 9.1% of semiconductor-grade Si pellets, 1 mm to 2 mm in size (percentages are given by weight). This source 22 was produced separately and prior to annealing by direct synthesis from elemental silicon and carbon. Source 22 had a grain size ranging from 0.3 mm to 1 mm. The purity of source 22 was determined by glow discharge mass spectrometry (GMDS) analysis. The results showed levels of boron and metal impurities below the detection limits of GDMS.

In this exemplary embodiment, graphite crucible 20 was made from dense, fine-grain, low-porosity, purified graphite ATJ from GrafTech International, LTD of Parma, Ohio, USA. Single crystal 5 boule was buried in the middle of source 22, as shown in FIG. 4.

Crucible 20 including single crystal 5 and source 22 was placed inside gas-tight chamber 24. Chamber 24 was then evacuated and filled with 500 Torr of high-purity argon containing less than 10 ppb of impurities.

Following this, crucible 20 was heated via RF coil 8 to a temperature of 2300° C. and soaked at this temperature for a period of 10 hours.

Upon completion of annealing, the boule of single crystal 5 was separated from source 22 and studied. Graphization was observed neither on source 22 nor on the surface of single crystal 5.

The annealed boule of single crystal 5 was sliced into wafers, which showed low warp and no signs of cracking or chipping, thus indicating a reduced degree of crystal stress.

In another exemplary embodiment, the foregoing method of ex-situ post growth annealing of single crystal 5 was accomplished utilizing the setup shown schematically in FIG. 6. Two 3-inch diameter boules of SiC single crystal 5, weighing a total of 350 g, were placed inside of porous graphite container 29 having a wall thickness of 3 mm. The boules of single crystals 5 were separated by a 3 mm thick disc 30. Container 29 and disc 30 were both made from porous graphite having the density of 1.05 g/cm$^3$ and porosity of 50%. Graphite enclosure 29 was buried in polycrystalline SiC source 22 having a grain size between 0.5 to 1.0 mm. The amount of SiC source used in this process was 700 g. Elemental silicon was added to source 22 in a concentration of 5 weight %. Loaded graphite crucible 20 was then placed inside of gas-tight chamber 24 and heated to 2250° C. in the presence of pure argon at a pressure of 400 Torr. The boules were annealed for 24 hours and then cooled to room temperature at a rate of 150° C. per hour.

Upon completion of annealing, the annealed boules of single crystals 5 were recovered from crucible 20 and studied. Only very minor traces of graphization were observed on the surfaces of the annealed single crystals.

The processing in accordance with the present invention of an exemplary boule of single crystal 5 grown by way of guided diameter expansion will now be described with reference back to FIG. 2.

A three inch diameter 6H—SiC seed crystal 4 was prepared with its faces cut parallel to the crystallographic (0001) plane. Seed crystal 4 was glued to the graphite seed-holder (or crucible lid 2) using a carbon-based adhesive. Graphite growth guide 12 with conical cavity and a cone angle of 30° was prepared and attached to the seed-holder (or crucible lid 2) as shown in FIG. 2. SiC source 3 comprising high-purity polycrystalline SiC grain of 1 mm to 3 mm in size was located at the bottom of crucible 1. Crucible 1 loaded with source 3, seed crystal 4 and growth guide 12 was placed inside growth chamber 6, where crucible 1 was surrounded by graphite thermal insulation 7. RF coil 8 positioned coaxially with respect to crucible 1 was utilized for heating. In preparation for growth, growth chamber 6 was evacuated and flushed with pure helium to remove oxygen, nitrogen and moisture. Sublimation growth was then carried out under a pressure of 20 Torr of helium in growth chamber 6 with the temperatures of the source and the seed at 2115° C. and 2090° C., respectively.

Upon completion of the growth cycle, the grown boule of single crystal 5 was in-situ annealed. To this end, the pressure of inert gas, e.g., helium, in growth chamber 6 was gradually raised from 20 Torr to between 300 and 600 Torr to terminate crystal growth. Simultaneously, RF power was gradually increased to maintain the temperature of graphite crucible 1 as constant as possible. Then, the RF coil 8 was gradually raised in the direction of arrow 13 to reduce the temperature difference between the top and bottom of graphite crucible 1, desirable to zero, and the RF power applied to RF coil 8 was increased until the temperature reached 2350° C. at the top and bottom of graphite crucible 1. Following this, graphite crucible 1 and, hence, the boule of single crystal 5 was soaked at this temperature for 24 hours and then cooled to room temperature over a period of 20 hours. Graphite lid 2 with the grown boule of single crystal 5 and growth guide 12 were recovered. Visual inspection with bright light revealed no cracks in the grown boule of single crystal 5.

Next, the boule of single crystal 5 was separated from growth guide 12 and graphite lid 2 by burning these graphite parts in oxygen in the manner discussed above in connection with furnace 14 of FIG. 3. More specifically, a flow of oxygen was established into furnace 14 at a rate of four standard cubic feet per hour. The furnace temperature was ramped to 1000° C. over a period of 8 hours, soaked for 8 hours, and then cooled to room temperature over 12 hours. Upon exposure to oxygen at 1000° C., the boule of single crystal 5 developed a bluish tint, indicating a presence of a thin $SiO_2$ layer on its surface.

Finally, the grown boule of single crystal 5 was subjected to high temperature ex-situ annealing. Specifically, the boule was placed into container 29 made of porous graphite as shown in FIG. 5.

Graphite container 29 including the boule of single crystal 5 weighing 200 grams was loaded into graphite crucible 20 and surrounded by polycrystalline SiC source 22 with a grain size between 0.5 mm and 1 mm. The weight of source 22 was about 500 grams. Source 22 was densely packed around porous graphite container 29 to avoid or eliminate voids. No elemental silicon was added to source 22. Loaded graphite enclosure 20 was then placed into a gas-tight chamber 24 equipped with RF coil 8. The temperature of crucible 20 was raised to 2350° C. over 8 hours and soaked at this temperature for 24 hours in the presence of 500 Torr of pure argon inside chamber 24. Upon completion of annealing, single crystal 5 was cooled to room temperature over 16 hours.

After ex-situ annealing, the boule of single crystal 5 was recovered from graphite crucible 20 and fabricated into 25 wafers, none of which were cracked.

The foregoing description of the growth of a boule of single crystal 5 by way of graphite growth guide 12 and the subsequent in-situ annealing, the separation of the boule of single crystal 5 from the graphite comprising growth guide 12, lid 2 or a seed-holder (not shown) attached to lid 2, and the ex-situ annealing of the boule of single crystal 5 is also applicable to boules of single crystals 5 grown without the use of growth guide 12 in the manner described above in connection with FIG. 1, for example.

As can be seen, the present invention is a three-step process of preparing crystals. The first step is the in-situ annealing of the boule, which is carried out immediately after crystal growth and without removing the crystal from the growth chamber. Compared to PVT growth, the in-situ annealing is carried out at higher temperatures, higher inert gas pressures and reduced temperature gradient.

The second step involves separating the crystal from graphite lid 2, a graphite seed-holder, if provided, and/or graphite growth guide 12, if provided, by burning these graphite parts in oxygen at elevated temperatures.

The third step is the annealing of the single crystal 5 at high temperatures in an atmosphere provided by polycrystalline SiC source 22.

The present invention reduces stress in grown crystals, especially crystals grown using growth guide 12. The present invention eliminates cracking during boule cooling to room temperature, during the separation from lid 2, a seed-holder, if provided, and/or growth guide 12, if provided, and during subsequent fabrication and wafer polishing.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of preparing a stress reduced sublimation grown crystal comprising:
   (a) providing a growth chamber having therein a graphite crucible including a sublimation source and a seed crystal in spaced relation and an induction coil disposed around the growth chamber and operative in response to electrical power being applied thereto to inductively heat the graphite crucible in the presence of no more than 200 Torr of inert gas in the growth chamber, whereupon a temperature gradient forms in the graphite crucible with the sublimation source at a first, sublimation temperature and the seed crystal at a second, lower temperature, and vapor from the sublimation source condenses on the seed crystal to form a grown crystal;
   (b) following the growth of the crystal in step (a), increasing the pressure of inert gas in the growth chamber to between 300 and 600 Torr and, simultaneously, controlling the power applied to the induction coil, whereupon the temperature of the graphite crucible remains substantially constant;
   (c) following step (b), moving the induction coil relative to the graphite crucible, or vice versa, whereupon the temperature gradient in the graphite crucible is reduced;
   (d) following step (c), controlling the electrical power applied to the induction coil whereupon the temperature in the graphite crucible increases to a temperature sufficient to anneal the grown crystal; and
   (e) after an annealing period of time has elapsed during which the interior of the graphite crucible is at the temperature sufficient to anneal the grown crystal, controlling the electrical power applied to the induction coil, whereupon the temperature of the interior of the graphite crucible decreases to room temperature over a cooling period of time, wherein steps (a)-(e) are performed without removing the grown crystal from the growth chamber.

2. The method of claim 1, wherein the growth chamber of step (a) includes a thermal insulation between an interior of the growth chamber and an exterior of the graphite crucible.

3. The method of claim 1, wherein:
   the seed crystal and the grown crystal are both single crystal silicon carbide (SiC); and
   the sublimation source is polycrystalline SiC.

4. The method of claim 3, wherein, at least one of:
   the annealing period of time is between 6 and 24 hours; and
   the cooling period of time is between 12 and 36 hours.

5. The method of claim 3, wherein the annealing temperature is between 2200° C. and 2400° C.

6. The method of claim 1, wherein, in step (d), the electrical power to the induction coil is controlled to raise the temperature inside the interior of the graphite crucible to the annealing temperature over a period of time between 0.5 and 1 hour.

7. The method of claim 1, wherein, inside the graphite crucible, the seed crystal is disposed in a cavity of a graphite growth guide which is operative for constraining the lateral growth of the grown crystal to said inner cavity during growth of the grown crystal.

8. The method of claim 1, wherein the seed crystal is coupled to an interior of the graphite crucible directly, via a graphite seed holder disposed between the seed crystal and the interior of graphite crucible, and/or via a graphite growth guide which is operative for constraining the lateral growth of the grown crystal to an inner cavity of the growth guide during growth of the grown crystal.

9. The method of claim 1, further including:
(f) in the presence of an oxygen rich atmosphere, heating the grown crystal, the seed crystal and any graphite that is attached to the grown crystal, the seed crystal, or both, as a result of the growth of the grown crystal to a reaction temperature sufficient to cause the oxygen to react with the graphite to foam a gas and become detached from the seed crystal and the grown crystal whereupon the grown crystal, the seed crystal, or both, are substantially graphite free.

10. The method of claim 9, further including, following step (f), cooling the substantially graphite free grown crystal, the substantially graphite free seed crystal, or both, to room temperature.

11. The method of claim 10, wherein at least one of:
the heating to the reaction temperature in the presence of an oxygen rich atmosphere is for a period of time between 6 and 12 hours;
the reaction temperature is between 700° C.-1100° C.; and
the cooling to room temperature of the substantially graphite free grown crystal, the substantially graphite free seed crystal, or both, occurs at a rate between 50° C. and 100° C. per hour.

12. The method of claim 9, wherein:
the seed crystal and the grown crystal are both single crystal silicon carbide (SiC).

13. The method of claim 9, wherein step (f) takes place in a furnace.

14. The method of claim 9, further including:
(g) surrounding the substantially graphite free grown crystal by a source material made of the same material as the grown crystal;
(h) heating the substantially graphite free grown crystal and surrounding source material for an annealing period of time in the presence of an inert gas to a temperature sufficient to anneal the grown crystal;
(i) after the annealing period of time of step (h) has elapsed, reducing the temperature of the substantially graphite free grown crystal and surrounding source material to room temperature over a cooling period of time.

15. The method of claim 14, wherein the substantially graphite free grown crystal and the surrounding source material are made from silicon carbide (SiC).

16. The method of claim 14, wherein the substantially graphite free grown crystal and the surrounding source material are housed in a porous graphite container that is received in a dense graphite crucible which is inductively heated to cause the heating of step (h).

17. The method of claim 16, wherein the graphite susceptor is heated in a manner to minimize a temperature gradient across the substantially graphite free grown crystal and the surrounding source material.

18. A method of preparing a stress reduced sublimation grown crystal comprising:
(a) sublimation growing a crystal in a crucible by way of a temperature gradient between the crystal and a source material in the presence of inert gas at a pressure between 1 and 200 Torr, wherein the source material is made of the same material as the crystal;
(b) with the crystal in the crucible, increasing the pressure of the inert gas to between 300 and 600 Torr while substantially maintaining the temperature gradient of step (a);
(c) with the crystal in the crucible, reducing the temperature gradient in the crucible;
(d) increasing the temperature in the crucible to a temperature sufficient to anneal the grown crystal; and
(e) following annealing of the grown crystal in the crucible, decreasing the temperature of the interior of the crucible to room temperature, wherein steps (a)-(e) are performed without removing the grown crystal from the crucible.

19. The method of claim 18, further including:
(f) following removal of the grown crystal from the crucible, heating the grown crystal in the presence of an oxygen rich atmosphere in an enclosure to a temperature sufficient to remove from the grown crystal material that is not part thereof.

20. The method of claim 19, further including:
(g) following removal of the grown crystal from the enclosure, heating the grown crystal surrounded by another instance of the source material in a crucible in the presence of an inert gas at a pressure between 200 and 600 Torr, wherein the grown crystal is heated to a temperature sufficient to anneal the grown crystal.

* * * * *

UNITED STATES PATENT AND TRADEMARK OFFICE
CERTIFICATE OF CORRECTION

| | | |
|---|---|---|
| PATENT NO. | : 7,767,022 B1 | Page 1 of 1 |
| APPLICATION NO. | : 11/788384 | |
| DATED | : August 3, 2010 | |
| INVENTOR(S) | : Gupta et al. | |

It is certified that error appears in the above-identified patent and that said Letters Patent is hereby corrected as shown below:

Column 13, line 7, Claim 9, "foam a gas" should read -- form a gas --

Signed and Sealed this

Twenty-third Day of November, 2010

David J. Kappos
*Director of the United States Patent and Trademark Office*